(12) United States Patent
Carlson et al.

(10) Patent No.: US 6,446,335 B1
(45) Date of Patent: Sep. 10, 2002

(54) DIRECT THERMAL COMPRESSION BONDING THROUGH A MULTICONDUCTOR BASE LAYER

(75) Inventors: Richard Lee Carlson, Ben Lomond, CA (US); Bruce Dale King; Rudolph Manuel Lopez, both of Tucson, AZ (US); Alex Irwin Panasiuk, Clinton Township, MI (US); George G. Zamora, Vail, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/542,918

(22) Filed: Apr. 4, 2000

Related U.S. Application Data

(60) Division of application No. 08/883,167, filed on Sep. 26, 1997, which is a continuation-in-part of application No. 08/851,853, filed on May 6, 1997, now abandoned.

(51) Int. Cl.$^7$ ............................................. H01R 43/04
(52) U.S. Cl. ............................. 29/861; 29/843; 29/844; 29/860
(58) Field of Search ........................ 29/832, 840, 843, 29/844, 861, 860

(56) References Cited

U.S. PATENT DOCUMENTS

| | | | |
|---|---|---|---|
| 4,091,529 A | | 5/1978 | Zaleckas |
| 4,644,092 A | | 2/1987 | Gentry ........................ 174/36 |
| 4,668,581 A | * | 5/1987 | Luc et al. |
| 4,795,079 A | * | 1/1989 | Yamada |
| 4,859,614 A | | 8/1989 | Sugahara et al. |
| 4,950,527 A | * | 8/1990 | Yamada |
| 4,954,874 A | | 9/1990 | Miura |
| 4,979,016 A | | 12/1990 | Lee |
| 5,006,917 A | | 4/1991 | Kang et al. .................. 357/70 |
| 5,046,953 A | | 9/1991 | Shreeve et al. ............... 439/66 |
| 5,059,553 A | | 10/1991 | Berndlmaier et al. |
| 5,060,049 A | | 10/1991 | Yamasaki et al. |
| 5,171,716 A | | 12/1992 | Cagan et al. |

(List continued on next page.)

FOREIGN PATENT DOCUMENTS

EP 177251 A1 9/1985

OTHER PUBLICATIONS

IBM Technical Disclosure Bulletin vol. 8, No. 8 Jan. 1966 p. 1167.*
IBM Technical Disclosure Bulletin vol. 10, No. 12, May 1968, p. 1937.*
Research Disclosure Oct. 1992, No. 342 #342115.*
"High Precision Flexible Printed Circuits", Y. Tanaka et al., Mektec Technical Update, Sep. 1994, vol. #5, pp. 1–8.

Primary Examiner—Carl J. Arbes
(74) Attorney, Agent, or Firm—John H. Holcombe

(57) ABSTRACT

A method of thermal compression bonding conductors of a multiconductor flat cable or electrical component by melting through a base layer from the reverse side of a base layer supporting the conductors. The multiconductor flat cable or electrical component comprises a base layer with conductors disposed thereon and a flat cover having an opening provided therein at a bonding site, preferably by die cutting. The flat cover with the opening is laminated to the base layer, overlaying the conductors, so that the conductors are mechanically stabilized by the base layer while being exposed through the bonding opening. The shape of the multiconductor flat cable or electrical component of the present invention may be highly varied. In one embodiment, the flat multiconductor electrical component circumferentially extends around a central area, for example, totally encompassing in IC chip which may be connected to the conductors thereof at a bonding site. The conductors fan out from the IC chip to connections at the outer perimeter, and the top cover is eliminated completely.

5 Claims, 5 Drawing Sheets

U.S. PATENT DOCUMENTS

| | | | |
|---|---|---|---|
| 5,175,060 A | 12/1992 | Enomoto et al. | 428/620 |
| 5,235,212 A | 8/1993 | Shimizu et al. | 257/780 |
| 5,283,947 A * | 2/1994 | Santo et al. | 29/840 |
| 5,321,204 A | 6/1994 | Ko | 174/52.4 |
| 5,376,588 A | 12/1994 | Pendse | |
| 5,378,859 A | 1/1995 | Shirasaki et al. | 174/261 |
| 5,389,741 A | 2/1995 | Ueno | 174/117 F |
| 5,446,239 A | 8/1995 | Mizutani et al. | 174/36 |
| 5,476,815 A | 12/1995 | Kawasumi | |
| 5,525,546 A | 6/1996 | Harada et al. | |
| 5,528,078 A | 6/1996 | Shin | 257/676 |
| 5,554,825 A | 9/1996 | Parker et al. | 174/117 F |
| 6,055,722 A * | 5/2000 | Tighe et al. | 29/843 |

* cited by examiner

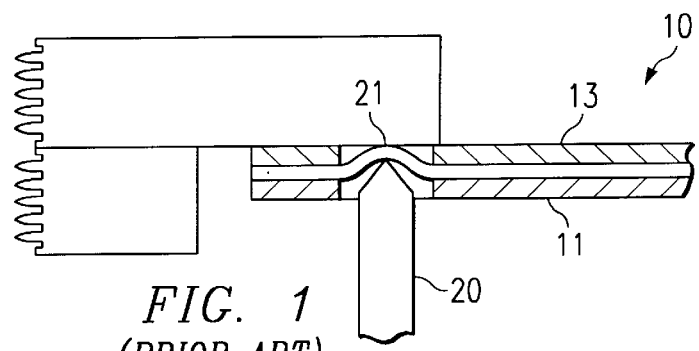
FIG. 1
*(PRIOR ART)*
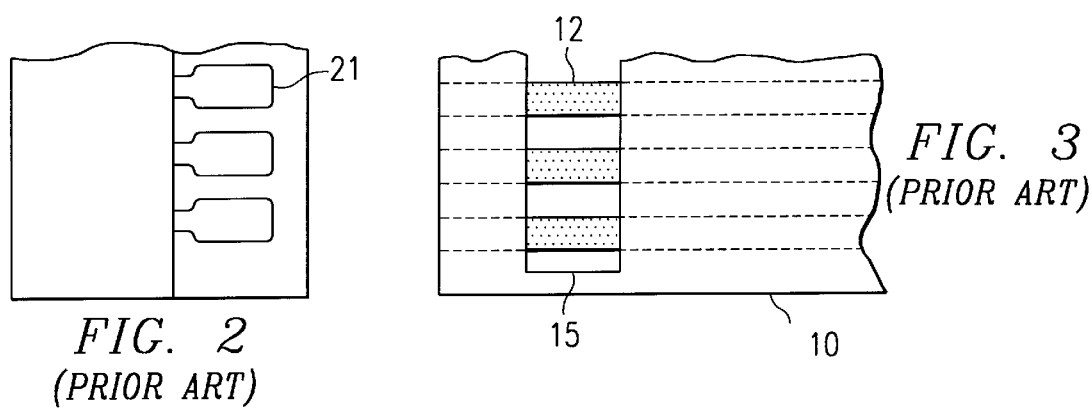
FIG. 2
*(PRIOR ART)*
FIG. 3
*(PRIOR ART)*
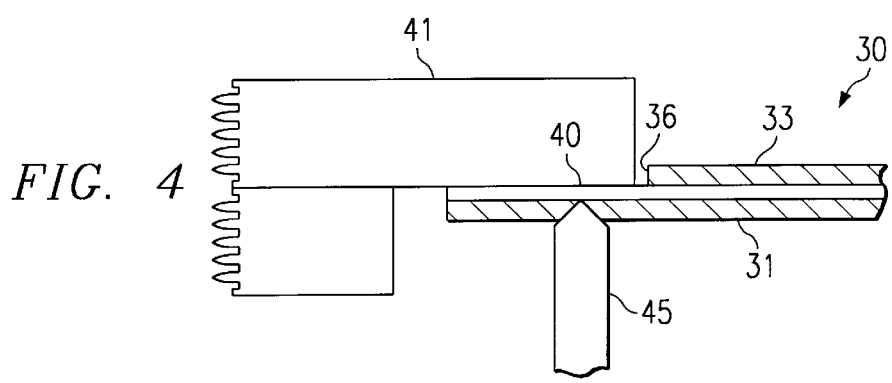
FIG. 4
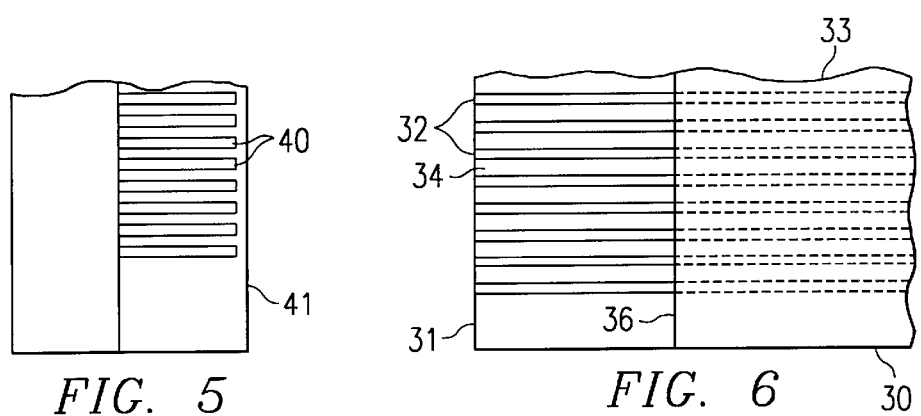
FIG. 5
FIG. 6

DIRECT THERMAL COMPRESSION BONDING THROUGH A MULTICONDUCTOR BASE LAYER

CROSS-REFERENCE TO RELATED APPLICATION

This application is a Divisional Application of Ser. No. 08/883,167, filed Sep. 26, 1997, and which Divisional Application is a continuation-in-part of U.S. application Ser. No. 08/851,853, entitled "BONDING OPENING IN MULTICONDUCTOR FLAT CABLE OR ELECTRICAL COMPONENTS", now abandoned, which was filed in the U.S. Patent & Trademark Office on May 6, 1997.

TECHNICAL FIELD

This invention relates to multiconductor flat cables or electrical components, and, more particularly, to bonding the conductors of the cables or components.

BACKGROUND OF THE INVENTION

Multiconductor flat cables are widely used in the electronics industry. Typically, such cables comprise a polyimide base layer and flat thin leads disposed thereon, with a top cover laminated to the base layer. The leads are most often formed by subtractive processes wherein a copper lamination on the base layer is etched to form a plurality of parallel conductors for the full length of the base layer. Other processes (i.e., additive) are sometimes used to provide the parallel conductors.

One process often used to create the connection between the cable leads and the bond pads of the device is a thermal compression bond, which uses heat and pressure to join the cable leads and the device bond pads in gang form.

Historically, when the cable lead density was low and the lead sizes were large, the leads extended beyond the end of the base and cover layers. These leads were large enough so that their mechanical strength was sufficient to tolerate most normal production handling. Also, the leads were widely separated and the pads to which the leads were bonded were oversized to accommodate small misalignment of the cable leads so as to still be within registration on the bond pads.

More recently, the requirements have increased for more leads in the cable without increasing the size of the cable, requiring increased cable lead density. Thus, the lead size has been reduced, and required a complimentary reduction in bond pad size, and therefore required improved registration of the cable with respect to the bond pads. To meet this requirement for improved registration with a smaller and mechanically weaker lead, a new cable was developed. The cable polyimide base and cover layers were extended to the end of the leads to provide improved mechanical strength. Then, a laser system was used to ablate an area of the cable and open a window through both the polyimide base and cover layers near the end of the cable to fully expose the cable leads. The remaining polyimide "frame" around the leads provided the additional mechanical strength and the window provided full access to the leads. The thermal compression bond anvil then used this window in the cable to contact the leads on one side and bond them to the bond pads on the other side.

Today, there is a demand for further increases in cable densities with even smaller leads and smaller bond pads. Attempts to extend the laser window technology to increased densities is resulting in increased handling damage and part rejection, driving up costs. Conductors are becoming only 2 mils in width and 0.7 mils thick and therefore are increasingly fragile. Thus, the lack of mechanical support is the major issue, causing the increased handling damage.

Another problem surfacing with the smaller conductors and corresponding bond pads is that residue from the laser ablation may condense back onto the conductors, requiring an aggressive cleaning process that attacks other areas of the cable and preventing a perfect bond and resulting in part rejection.

Thus, what is needed is a way of providing mechanical support for the fragile conductors of a multiconductor flat cable without interfering with the bonding process.

SUMMARY OF THE INVENTION

A bonding opening exposing conductors through a top cover of a multiconductor flat cable or electrical component to allow direct bonding thereof is disclosed. The multiconductor flat cable comprises a base layer with conductors disposed thereon and a flat cover having an opening provided therein at a bonding site, preferably by die cutting. The cover with the opening is laminated to the base layer, overlaying the conductors, so that the conductors are mechanically stabilized by the base layer while being exposed through the bonding opening.

Preferably, the cover and base layers are of polyimide, and the preferred bonding method is thermal compression bonding.

The shape of the multiconductor flat cable or electrical component of the present invention may be highly varied. In one embodiment, the flat multiconductor electrical component circumferentially extends around a central area, for example, totally encompassing an IC chip which may be connected to the conductors thereof at a bonding site. The conductors fan out from the IC chip to connections at the outer perimeter, and the top cover is eliminated completely.

For a fuller understanding of the present invention, reference should be made to the following detailed description taken in conjunction with the accompanying drawings.

BRIEF DESCRIPTION OF THE DRAWINGS

FIG. 1 is a side, partially sectioned view of a prior art multilayer cable, connected device and thermal compression arbor.

FIG. 2 is a partial plan view of the bond pad view of the connected device of FIG. 1;

FIG. 3 is a partial plan view of the top of the prior art multilayer cable with thermal bond window of FIG. 1;

FIG. 4 is a side, partially sectioned view of a multilayer cable of the present invention, a connected device and thermal compression arbor;

FIG. 5 is a partial plan view of the bond pad view of the connected device of FIG. 4;

FIG. 6 is a partial plan view of the top of the multilayer cable with supported conductors of FIG. 4 in accordance with the present invention.

DETAILED DESCRIPTION OF THE INVENTION

Figure 7A:
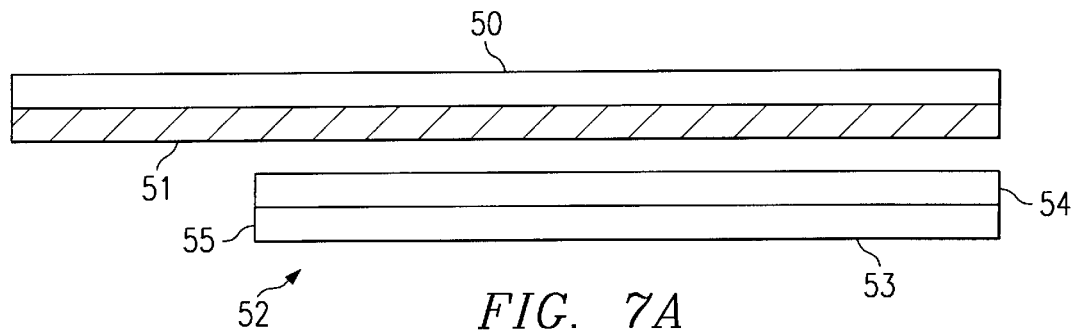
FIGS. 7A, 7B, and 7C are sectioned views of multilayer cables of the present invention made with an additive process.

Referring to FIGS. 1 through 3, the prior art multilayer cable 10 comprises a bottom polyimide base 11 on which conductors 12 are deposited or etched, and a top layer 13. The base and the top cover layers are extended to the end of the leads to provide improved mechanical strength. Then, a laser system is used to ablate an area of the cable and open a window 15 through both the polyimide base and cover layers near the end of the cable to fully expose the cable leads 12. The remaining polyimide "frame" around the leads provides the additional mechanical strength and the window provided full access to the leads. The thermal compression bond anvil 20 then uses this window in the cable to contact the leads on one side and bond them to the bond pads 21 on the other side.

As discussed above, there is now a demand for further increases in cable densities with even smaller leads and smaller bond pads. Attempts to extend the laser window technology to increased densities results in manufacturing and increased handling damage and part rejection, driving up costs. Conductors are becoming only 2 mils in width and 0.7 mils thick and therefore are becoming increasingly fragile so that the lack of mechanical support is causing the increased handling damage.

Referring to FIGS. 4 through 6, the cable or electrical component 30 of the present invention comprises a base layer 31 on which are disposed a plurality of conductors 32. Preferably, the base layer is a polyimide, commercially available material. The conductors may be formed in any suitable manner, but preferably are formed in a conventional subtractive or additive process. For example, the bottom flat cover with a laminated layer of copper is commercially available. The base layer with an adhesive layer alone or with the addition of the laminated layer of copper is available under the trade name "Kapton/Pyralux", from the duPont Corporation. Another, similar material is available under the trade name of "Apacal", from Nippon Mektron, Ltd.

Using conventional processes, the copper layer is masked, utilizing a photolithographic mask, and etched to form parallel conductors 32. It is expected that 80 or 100 parallel conductors will be formed for a single cable, or 300 to 1000 parallel conductors for an electrical component.

The base layer 31 and the conductors 32 may be formed by any of several alternative means, including subtractive processes, direct lamination or additive processes.

In accordance with the present invention, the base layer 31 provides full mechanical support of the conductors 32 during handling in the cable manufacturing process and for subsequent bonding, as will be described.

A cover 33 is provided, which may also be polyimide as described above, but without the copper lamination.

In accordance with the present invention, the cover 33 is modified by providing an opening 36 therein at the bonding site 34 for the cable. The bonding site may be at any appropriate location on the cable, and the opening 36 may be in a shape corresponding to the bonding site.

Opening 36 is preferably provided by die cutting, which provides a true edge at low cost. Alternative means may also be used, such as ablation or etching, to form opening 36.

The cover 33, as modified with the opening 36 therein, is then laminated to the base layer 31 overlying the conductors 32, as illustrated in FIG. 6. In the instance where the cover layer is the above described polyimide with an adhesive layer, the lamination comprises placing the cover 33 onto the base layer overlying the conductors 32 as illustrated in FIG. 6, and then applying heat and pressure to the cover and base layer. The amount of heat and pressure is defined by the polyimide and adhesive suppliers, above.

Although multilayer flat cables are discussed hereinafter, the present invention is equally applicable to any electrical component having a base layer and multiple conductors that are to be bonded. An example may comprise an electronic circuit or chip formed on a polyimide base layer, having conductors 32 at one edge which are to be bonded to a connector.

The more generic term, "electrical component", is intended to include various forms of cables, various forms of circuitry and equivalents thereof.

When laminated into a single unit, cable or electrical component 30 appears as illustrated in FIGS. 4 and 6, with base layer 31 supporting the conductors 32, and with cover 33 overlying the conductors. Only the portion of the conductors at the bonding site 34 are exposed through the opening 36.

The completed cable or electrical component 30 is then in condition for bonding to bond pads 40 of device 41 in FIGS. 4 and 5. Using the exemplary cable 30 of FIG. 6 and device 41 in FIG. 5, the cable 30 and device 41 are each rotated 90 degrees in opposite directions into the respective positions illustrated in FIG. 4.

The conductors 32 of component 30 are aligned then with the corresponding bond pads 40 of device 41. The alignment is significantly easier as the result of the stability of the conductors 32 as provided by the base layer 31 to which the conductors are attached.

A thermal compression anvil 45 is provided and engages the cable 30, pressing the conductors 32 at the opening 36 into engagement with the corresponding bond pads 40 and, using conventional thermal compression bonding techniques, modified to have a higher temperature so as to melt through the base layer 31, bonds the conductors 32 to the bond pads 40. Since the conductors 32 are in engagement with the corresponding bond pads 40 at the moment of thermal compression bonding, there is no opportunity for any melted plastic or other material to interfere with the bonding therebetween. Also, there is no opportunity for the conductors to slip or deform during the moment when the base layer is melted at the point of bonding.

Alternative bonding techniques may be utilized, and will be more likely to be successful given the mechanical stability provided to the conductors 32 by the present invention.

There are many benefits resulting from use of the present invention. Since the opening 36 does not require the prior art window laser ablation, the related cleaning operations are eliminated, reducing cost and increasing yield. Conductor lead position is now immune from distortion due to cleaning and operation handling due to the support of base layer 31, thereby substantially eliminating misposition yield losses. Registration between the leads 32 and the bond pads 40 is now more tolerant, because the supported leads hold their position better.

Figure 7B:
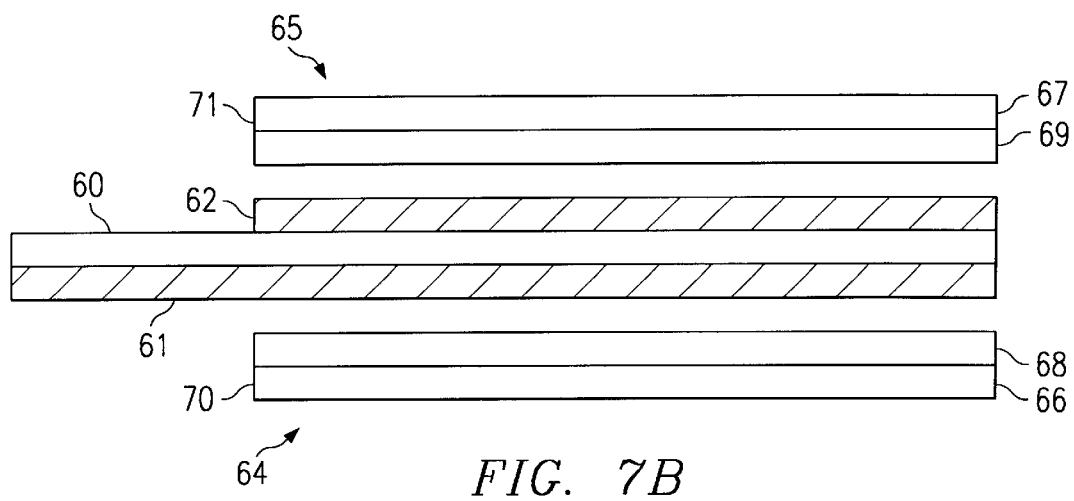
Figure 7C:
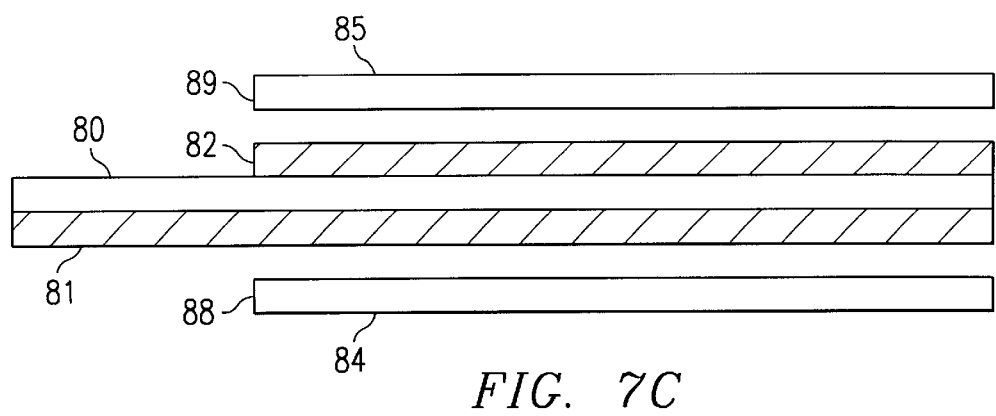

FIGS. 7A, 7B and 7C illustrate various types of multilayer cables or electrical components of the present invention having the conductors formed by additive processes on adhesiveless base layers.

In FIG. 7A, base polyimide layers 50 is provided, on which copper conductors 51 are deposited. The cover 52 comprises a polyimide layer 53 on which is applied a layer 54 of adhesive. Opening 55 of the present invention is cut into the cover 52, and the cover is then laminated to the base layer.

In FIG. 7B, a base layer 60, preferably polyimide, is provided, and copper conductors 61 and copper layer 62 are deposited thereon. Copper layer 62 may comprise a shield layer or may comprise another set of conductors. Two covers 64 and 65 are provided, each comprising polyimide layers 66 and 67, respectively, having adhesive layers 68 and 69, respectively, thereon. openings 70 and 71 of the present invention are cut into the covers 64 and 65, and the covers are laminated to the base or copper layers.

In FIG. 7C, a base layer 80 is provided and copper conductors 81 and copper layer 82 deposited thereon, similar to layers 60, 61 and 62 of FIG. 7B. Two covers 84 and 85 of a low temperature plastic are provided and openings 88 and 89 are cut into the covers 84 and 85, respectively. Covers 84 and 85 are then placed in contact with the base layer and copper 80, 81 and 82, and heated so as to melt and affix to the base layer and copper.

Figure 8A:
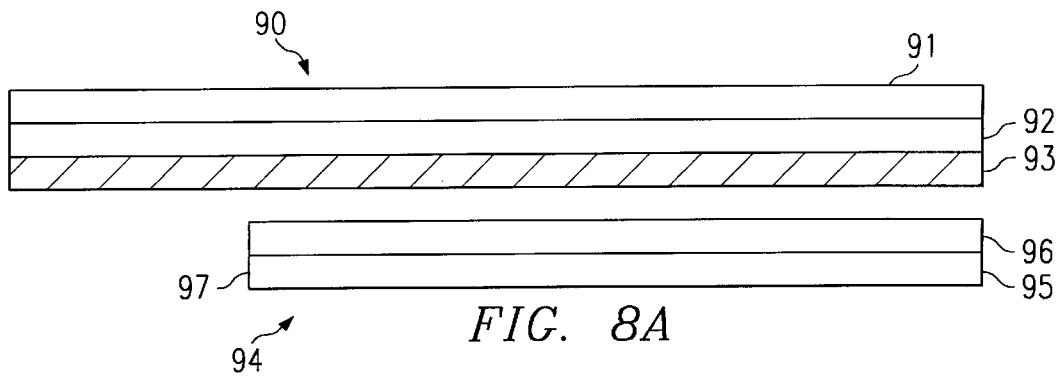
FIGS. 8A, 8B, and 8C are sectioned views of multilayer cables of the present invention made with a subtractive process.
Figure 8B:
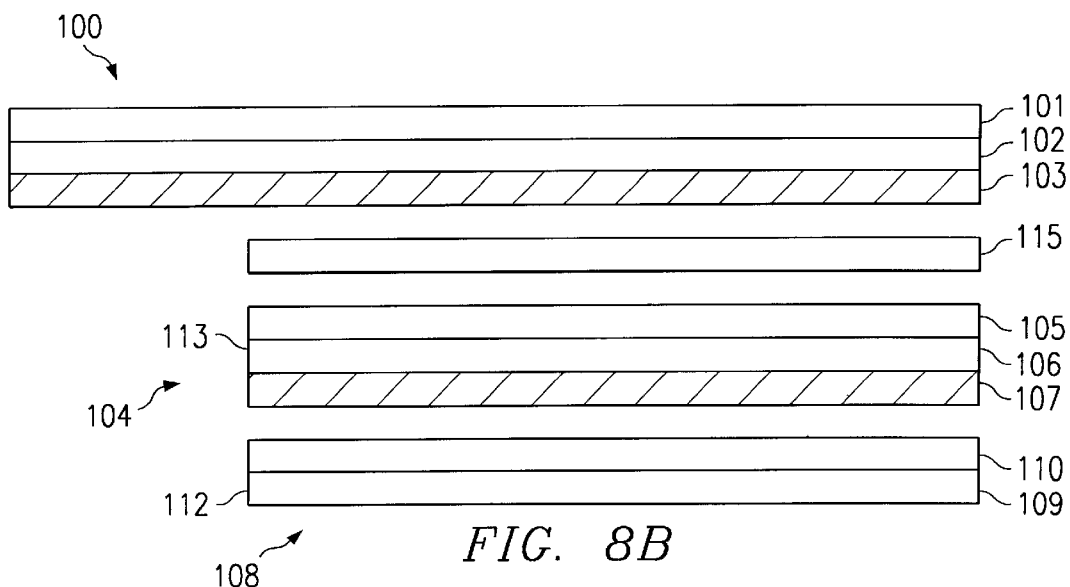
Figure 8C:
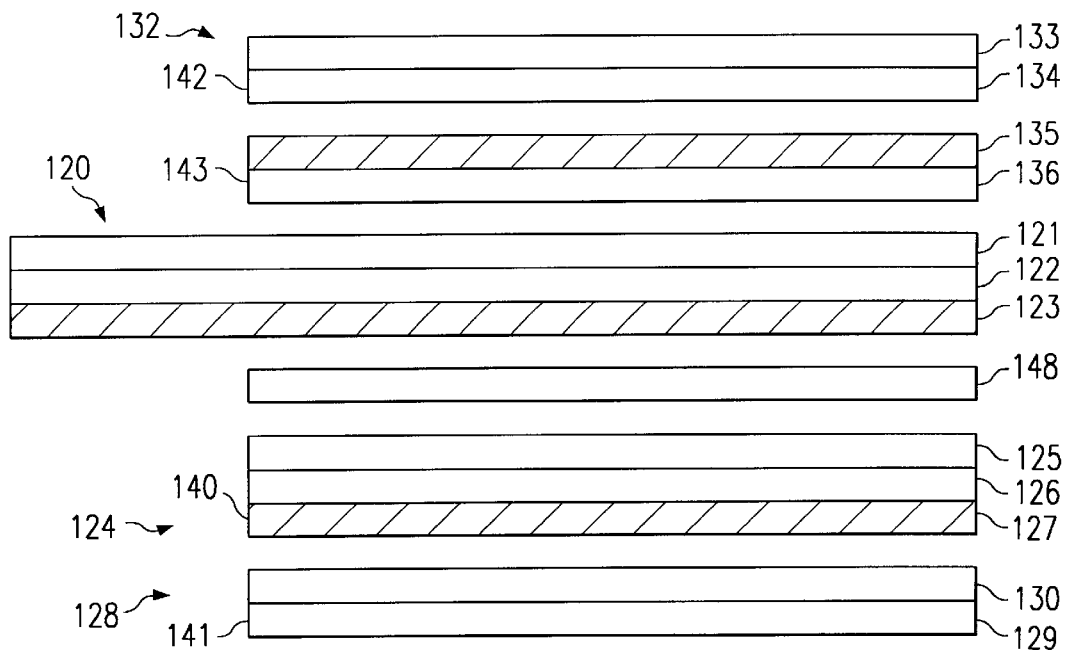

FIGS. 8A, 8B and 8C illustrate various types of multilayer cables or electrical components of the present invention having the conductors subtractively formed from a base layer having a conductive layer adhesively affixed thereon.

In FIG. 8A, a base 90 comprises a multilayer unit of a base layer 91, adhesive 92 and a layer 93 of conductive material, preferably copper. In a subtractive process, such as etching, portions of the conductive material are removed to form a set of conductors. A cover 94 comprises a polyimide layer 95, or equivalent, on which is applied a layer 96 of adhesive. Opening 97 of the present invention is cut into the cover 94, and the cover is then laminated to the base layer unit 90.

In FIG. 8B, a two metal layer cable is illustrated. Base layer unit 100 comprises a base layer 101, preferably of polyimide, an adhesive 102 and a layer 103 of conductive material, preferably copper. Portions of the conductive material are removed in a subtractive process to form a set of conductors. A second base layer unit 104 is provided, comprising a base layer 105, adhesive 106 and a conductive layer 107. The conductive layer 107 may be left as is to form a shield, or may have portions removed to form another set of conductors. A cover 108 comprises a polyimide layer 109 on which is applied a layer 110 of adhesive. Openings 112 and 113 are cut. in cover 108 and second base layer unit 104, respectively, in accordance with the present invention. A layer 115 of adhesive is applied to second base layer unit 104, and the cover 108 and second base layer unit 104 are laminated to the base layer unit 100.

A three metal layer cable is illustrated in FIG. 8C. Base layer unit 120 comprises a base layer 121, preferably of polyimide, an adhesive 122 and a layer 123 of conductive material, preferably copper. Portions of the conductive material are removed in a subtractive process to form a set of conductors. A second base layer unit 124 is provided, comprising a base layer 125, adhesive 126 and a conductive layer 127. A cover 128 comprises a layer 129, such as polyimide, on which is applied a layer 130 of adhesive. A second cover 132 comprises a layer 133, such as polyimide, on which is applied a layer 134 of adhesive. A third conductive layer 135 is provided, which may comprise a thin copper sheet, having an adhesive 136 thereon.

Openings 140, 141, 142 and 143 are cut in second base layer 124, cover 128, second cover 132 and conductive layer 135, respectively, in accordance with the present invention. An adhesive 148 is applied to second base layer unit 124 and the components are laminated together to form a multi layer cable.

The shape of the multiconductor flat cable of the present invention may be highly varied. One embodiment is illustrated in FIG. 9, which may be used to provide external board-level connections for an integrated circuit (IC) chip.

Figure 9:
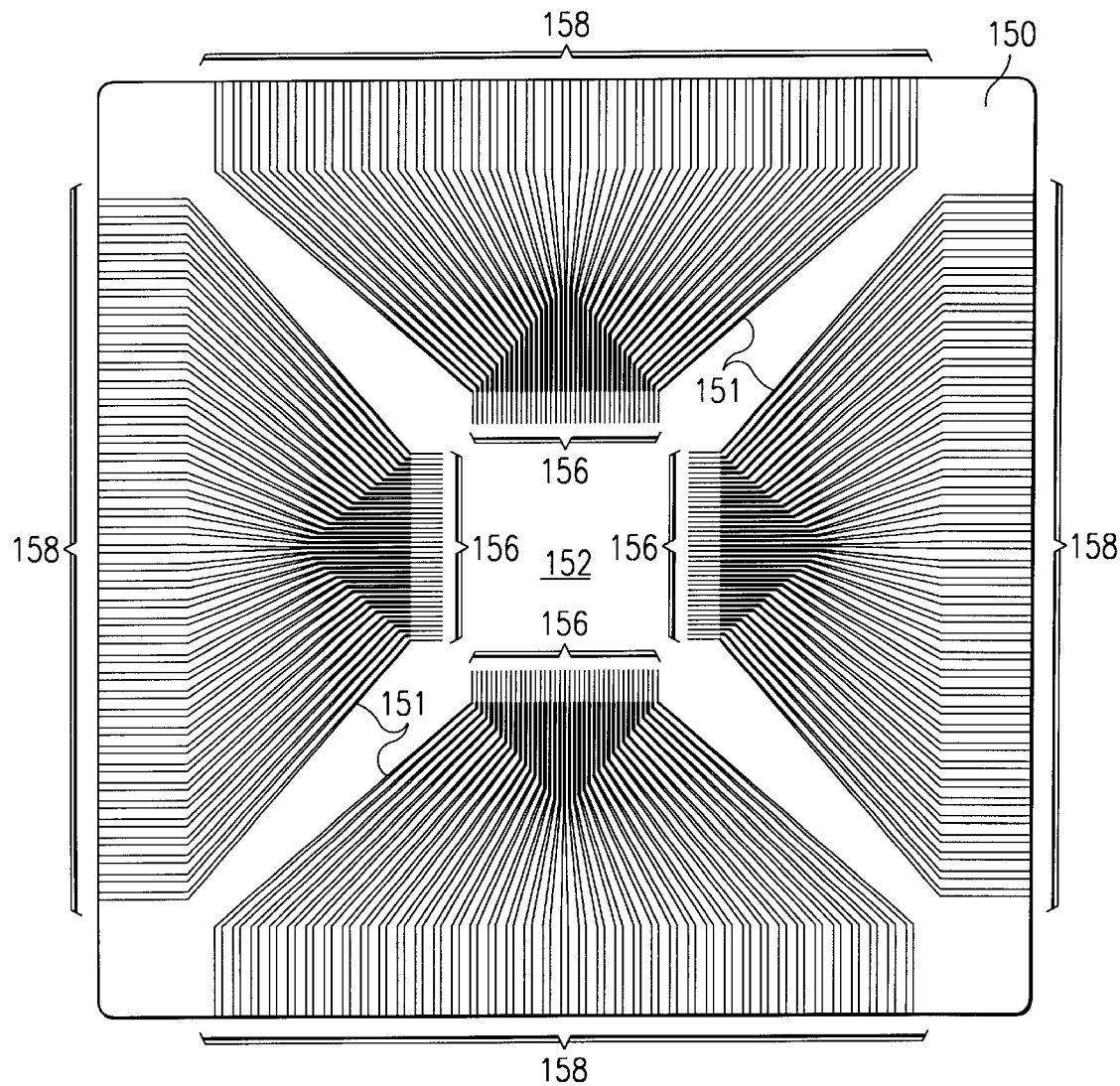
FIG. 9 is a top view illustration of base layer and conductors of the multiconductor electrical component of the present invention for connecting to an IC chip.

The embodiment illustrated in FIG. 9 includes a base layer 150 on which a plurality of conductors 151 are disposed. The conductors 151 circumferentially extend around a central area 152 of the base layer 150. The layout of FIG. 9 is particularly suited for connection to an integrated circuit chip placed in central area 152, and to a printed circuit card, as will be explained. In the illustrated embodiment, the conductors 151 totally encompass central area 152. Due to the protected environment, no cover layer need be provided. Thus, the terminations of conductors 151 provide inner bonding sites 156 and outer bonding sites 158.

Presently, IC chips are interconnected to printed circuit (PC) cards using many methods. The most popular are wire bond, flip chip, and tape automated bonding (TAB). Wire bonding comprises stitching gold or aluminum wire to pads on a chip or pads on the circuit board. The limitations to this process are the size of the pad and the speed of a bonder which bonds one wire at a time. Flip chip is a process where solder balls are deposited on pad sites on chips and reflowed to a substrate. This also has its limitations because of pad size and the solder bumping requirements.

Figure 10:
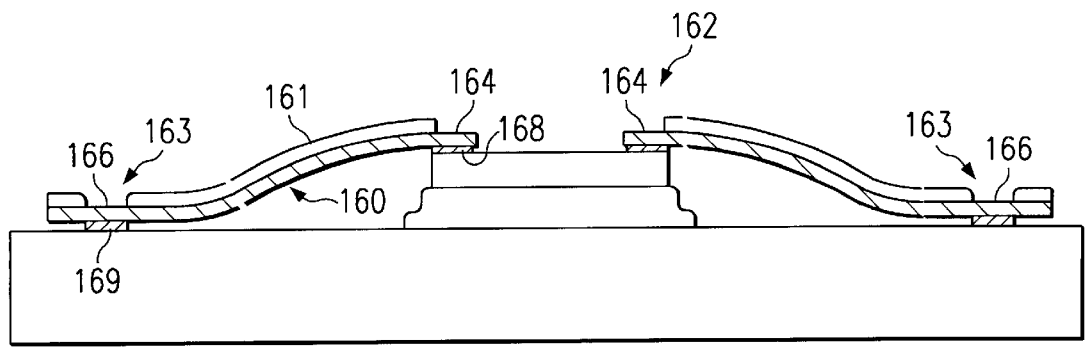
FIG. 10 is a sectioned view of a prior art IC connection.

In the existing TAB process the inner leads form a square or rectangular shape, depending on the geometry of the IC. This IC is then interconnected via welding or thermocompression bonding each lead at a time. As illustrated in FIG. 10, conductors 160 are deposited on polyimide 161 and laser ablation or chemical etching used to provide windows 162 and 163. The inner leads 164 are usually cantilevered and unsupported on either side of the polyimide flex circuit. For this reason, they are susceptible to handling damage. The outer leads 166 on a TAB process are a in window. They are unsupported conductors on top and bottom, however, they are supported at each end (hence, not cantilevered). The connections to IC pads 168 must be first aligned perfectly and made one at a time. The PC board connections are easier to align, but are best made one at a time.

Figure 11:
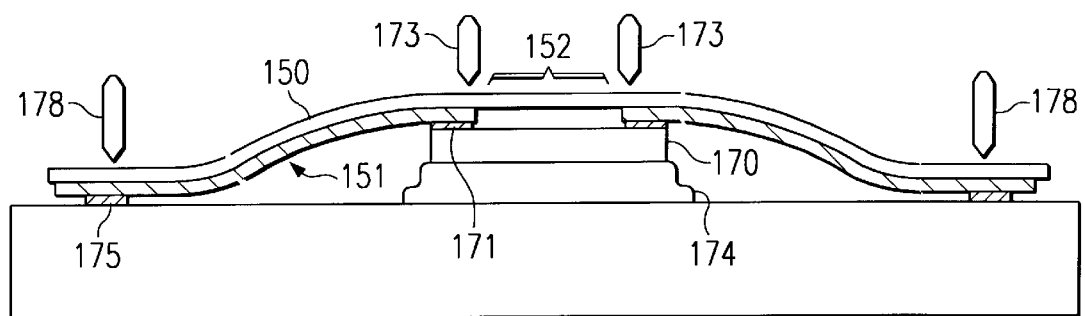
FIG. 11 is a sectioned view of the base layer and conductors of FIG. 9, connected to an IC chip and PC board.

As illustrated in FIGS. 9 and 11, a base layer 150 of the present invention fully covers the IC 170 at area 152. The conductors 151 circumferentially extend around the central area 152. In the illustrated embodiment, the conductors 151 totally encompass central area 152. Conductors 151 fan out from central area 152 to the outer periphery. An opening may be cut into base layer 150 at central area 152 if access is required to the top of IC 170.

IC chip 170 may be placed in central area 152 and pads 171 aligned with and bonded to conductors 151 at inner bonding sites 156. The bonding is preferably accomplished by thermal compression bonding employing anvils 173 to bond through the base layer 150.

The conductors 151 of the embodiment of the present invention at the bonding sites 156 are not susceptible to the handling damage of the prior art. Also, the geometry has no limitation on physical size or shape. Therefore, the size of the conductors and the pitch may easily correspond to the pitch on the IC. The IC may be placed on PC board 172 with epoxy 173.

The conductors 151 of the embodiment of the present invention at the outer bonding sites 158 may be connected to board terminals 175. The conductors 151 and board terminals would be aligned and bonded, preferably by thermal compression bonding employing anvils 178 to bond through the base layer 150.

The base layer 150 supports conductors 151 at bonding sites 158 in the same manner that it improved the inner leads/conductors from handling damage. Again, the physical size of the conductors and pitch would have no limitations (i.e. make as small as possible to use as little real estate on the PC card and maximize the conductors needed from the IC). Another advantage is that the delta in thermal stresses would be taken-up by the flex circuit as it does today for TAB.

The final assembly may be referred to a "chip-on-board" assembly. The IC chip 170 in central area 152 is preferably encapsulated and the bonds at bonding sites 156 are also preferably encapsulated to provide additional protection and support.

Figure 12:
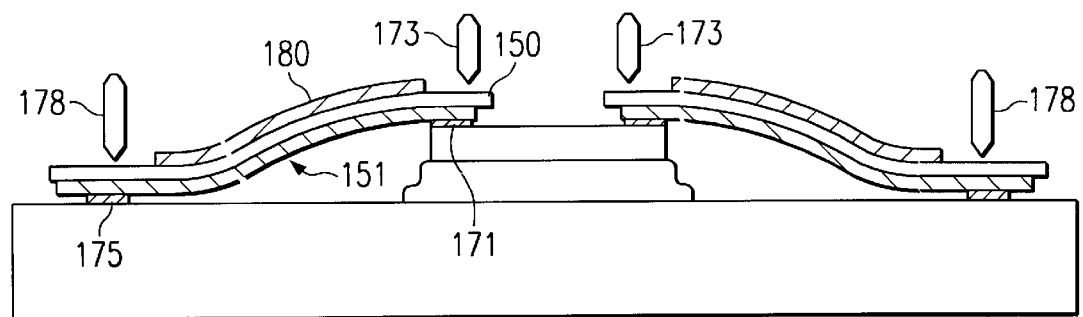
FIG. 12 is a sectioned view of an alternative embodiment of the base layer and conductors of the present invention connected to an IC chip and PC board.

FIG. 12 illustrates an alternative embodiment of the electrical component of the present invention. Conductors 151 are deposited on base layer 150 as with respect to the embodiment of FIGS. 9 and 11. In addition, a shield layer 180 is provided, preferably of copper, which may be gold plated. The shield layer 180 may protect the conductors 151 from external radiation.

The shapes of the circumferentially extending conductors may be highly varied. In addition to the illustrated rectangular shape of the boundary of the central area, various other multi-sided or rounded shapes are possible. Additionally, the conductors on the flat base layer need not fully encompass the central area, but may circumferentially extend about two or more, but not all, sides or portions of the central area. For example, the shape may be a "C" shape or an "L" shape, as well as many other shapes.

While the preferred embodiments of the present invention have been illustrated in detail, it should be apparent that modifications and adaptations to those embodiments may occur to one skilled in the art without departing from the scope of the present invention as set forth in the following claims.

We claim:

1. A method of thermal compression bonding conductors of a multiconductor flat electrical component to corresponding bond pads at a bond site of said component, said multiconductor flat electrical component comprising a substantially uniform flat base layer having a plurality of conductors disposed on a surface of said substantially uniform base layer, said substantially uniform base layer fully and continuously supporting and mechanically stabilizing said conductors, and a flat cover, comprising the steps of:

providing an opening in said flat cover at said bond site; and laminating said flat cover to said base layer to overlie said plurality of conductors so that said opening exposes said conductors through said flat cover opening at said bond site;

aligning said exposed conductors at said flat cover opening with said corresponding bond pads; and thermal compression heating and pressing said aligned conductors into contact with said corresponding bond pads, thereby direct thermal compression bonding said aligned conductors with said corresponding bond pads, said thermal compression heating and pressing step conducted at a temperature sufficient to melt through said base layer and bond said conductors to said bonding pads.

2. The method of bonding conductors of claim 1, wherein:

said thermal compression step is conducted from the side of said base layer opposite said conductors by an anvil which protrudes into said base layer.

3. The method of claim 1, wherein:

said providing step comprises die cutting said opening.

4. A method of thermal compression bonding conductors of a multiconductor flat electrical component to corresponding bond pads at a bonding site of said component, said multiconductor flat electrical component comprising a substantially uniform flat base layer having a plurality of conductors disposed on a surface of said substantially uniform base layer, terminating at said bonding site, said substantially uniform flat base layer fully and continuously supporting and mechanically stabilizing said conductors, comprising the step of:

positioning said multiconductor flat electrical component so said surface having said plurality of conductors is adjacent said corresponding bond pads;

aligning said conductors at said bonding site with said corresponding bond pads; and thermal compression heating and pressing, from the side of said base layer opposite said surface having said plurality of conductors, said aligned conductors into contact with said corresponding bond pads, thereby direct thermal compression bonding said aligned conductors with said corresponding bond pads, said thermal compression heating and pressing step conducted at a temperature sufficient to melt through said base layer and bond said conductors to said bonding pads.

5. The method of bonding conductors of claim 4, wherein:

said thermal compression step is conducted by an anvil which protrudes into said base layer from said opposite side of said base layer.

* * * * *